US010151806B2

(12) United States Patent
Schmitt et al.

(10) Patent No.: US 10,151,806 B2
(45) Date of Patent: Dec. 11, 2018

(54) METHOD AND APPARATUS FOR MANUFACTURING A MAGNETIC SENSOR DEVICE, AND CORRESPONDING MAGNETIC SENSOR DEVICE

(71) Applicant: SENSITEC GMBH, Lahnau (DE)

(72) Inventors: Jochen Schmitt, Biedenkopf (DE); Johannes Paul, Mainz (DE); Ronald Lehndorff, Mainz (DE); Jürgen Wahrhusen, Nieder-Hilbersheim (DE); Claudia Glenske, Leun (DE)

(73) Assignee: SENSITEC GMBH, Lahnau (DE)

( * ) Notice: Subject to any disclaimer, the term of this patent is extended or adjusted under 35 U.S.C. 154(b) by 0 days.

(21) Appl. No.: 15/527,678

(22) PCT Filed: Sep. 15, 2015

(86) PCT No.: PCT/EP2015/071061
§ 371 (c)(1),
(2) Date: May 17, 2017

(87) PCT Pub. No.: WO2016/078793
PCT Pub. Date: May 26, 2016

(65) Prior Publication Data
US 2017/0328963 A1   Nov. 16, 2017

(30) Foreign Application Priority Data
Nov. 19, 2014   (DE) .................. 10 2014 116 953

(51) Int. Cl.
*G01R 33/09*   (2006.01)
*G01R 33/00*   (2006.01)
(Continued)

(52) U.S. Cl.
CPC ....... *G01R 33/093* (2013.01); *G01R 33/0052* (2013.01); *G01R 33/098* (2013.01);
(Continued)

(58) Field of Classification Search
CPC ..... G01R 33/093; G01R 33/098; H01L 43/10; H01L 43/12; H01L 27/22
See application file for complete search history.

(56) References Cited

U.S. PATENT DOCUMENTS

| 5,561,368 A | 10/1996 | Dovek et al. |
| 6,074,707 A * | 6/2000 | Nakazawa ............. B82Y 25/00 |
| | | 257/E43.006 |

(Continued)

FOREIGN PATENT DOCUMENTS

| DE | 19520206 A1 | 12/1996 |
| DE | 102008041859 A1 | 3/2010 |

(Continued)

OTHER PUBLICATIONS

International Search Report for PCT/EP2015/071061, dated Apr. 6, 2016.

*Primary Examiner* — Benjamin Sandvik
*Assistant Examiner* — Farid Khan
(74) *Attorney, Agent, or Firm* — Merchant & Gould P.C.

(57) ABSTRACT

A method and an apparatus are for the permanent magnetization of at least one ferromagnetic layer in a magnetic field sensor device deposited on a chip substrate. The method includes production of at least one resistance element on a chip substrate, deposition of at least one soft magnetic structuring element on the chip substrate; heating of the resistance element to above the blocking temperature and coupling of a preconditioning magnetic field; cooling of the resistance element to below the blocking temperature; and removal of the preconditioning magnetic field. The soft magnetic structuring element is arranged such that the coupled preconditioning magnetic field penetrates the structuring element substantially perpendicular to the chip surface and, at the location of the resistance element, generates (Continued)

magnetic field components parallel to the chip surface which penetrate the ferromagnetic layer of the resistance element at least in some areas.

12 Claims, 10 Drawing Sheets

(51) Int. Cl.
*H01L 43/12* (2006.01)
*H01L 27/22* (2006.01)
*H01L 43/10* (2006.01)

(52) U.S. Cl.
CPC .............. *H01L 27/22* (2013.01); *H01L 43/10* (2013.01); *H01L 43/12* (2013.01)

(56) References Cited

U.S. PATENT DOCUMENTS

| | | | |
|---|---|---|---|
| 6,501,678 B1 | 12/2002 | Lensssen et al. | |
| 8,715,776 B2 | 5/2014 | Guo et al. | |
| 2002/0180433 A1 | 12/2002 | Van Zon et al. | |
| 2003/0161181 A1* | 8/2003 | Saito | G11C 11/16 365/173 |
| 2004/0078959 A1* | 4/2004 | Siegle | B82Y 25/00 29/603.14 |
| 2006/0044700 A1* | 3/2006 | Paul | B82Y 25/00 360/316 |
| 2006/0226940 A1 | 10/2006 | Lee et al. | |
| 2010/0276389 A1* | 11/2010 | Mather | B82Y 25/00 216/22 |
| 2011/0074406 A1* | 3/2011 | Mather | B82Y 25/00 324/252 |
| 2011/0151589 A1 | 6/2011 | Redon | |
| 2012/0049843 A1 | 3/2012 | Sun et al. | |
| 2012/0200292 A1* | 8/2012 | Sugihara | B82Y 25/00 324/252 |
| 2013/0265039 A1* | 10/2013 | Cai | G01R 33/098 324/252 |
| 2016/0172092 A1* | 6/2016 | Bertacco | G11B 5/855 335/284 |

FOREIGN PATENT DOCUMENTS

| | | |
|---|---|---|
| DE | 112009001140 T5 | 6/2011 |
| DE | 102012208882 A1 | 12/2012 |
| JP | 2010-066262 A | 3/2010 |
| WO | 96/38738 A1 | 12/1996 |

\* cited by examiner

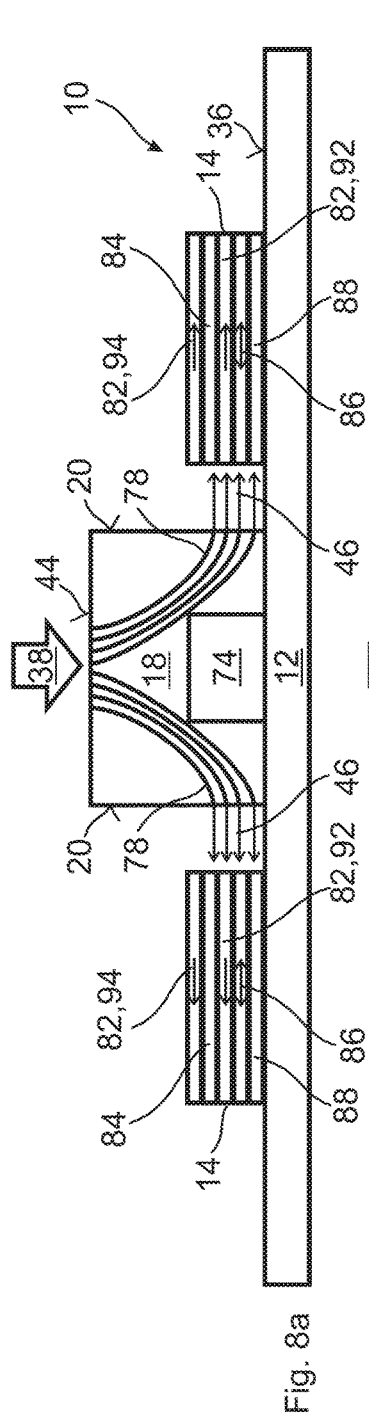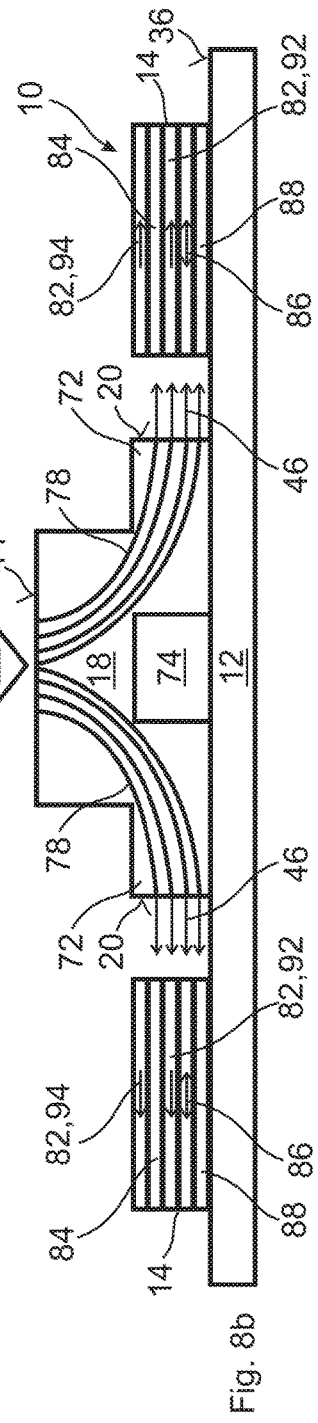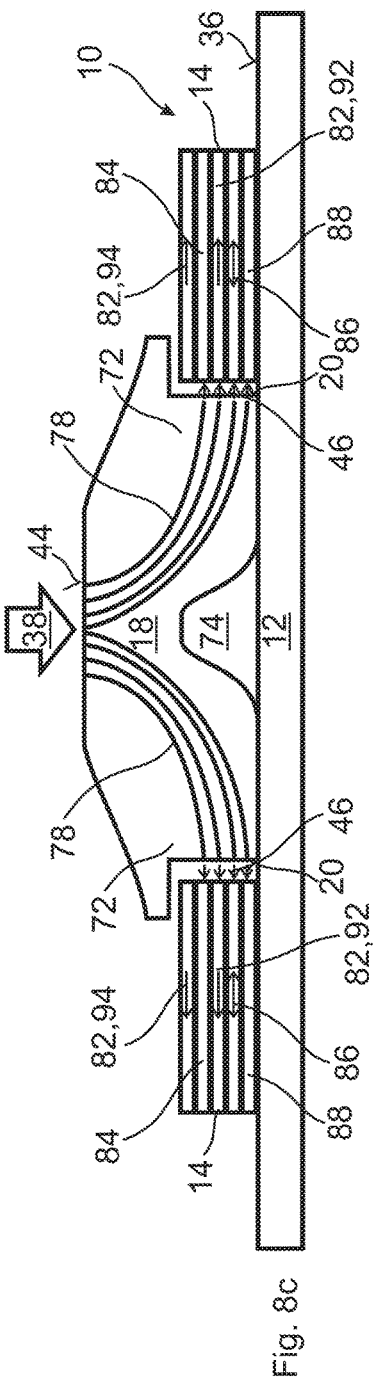

METHOD AND APPARATUS FOR MANUFACTURING A MAGNETIC SENSOR DEVICE, AND CORRESPONDING MAGNETIC SENSOR DEVICE

This application is a National Stage Application of International Patent Application No. PCT/EP2015/071061, filed Sep. 15, 2015, which claims benefit of German Patent Application No. 10 2014 116 953.0, filed Nov. 19, 2014 and which applications are incorporated herein by reference. To the extent appropriate, a claim of priority is made to each of the above disclosed applications.

BACKGROUND OF THE INVENTION

The invention relates to a method and apparatus for producing a magnetic field sensor device as well as to a magnetic field sensor device produced by the method according to the invention. In particular, the invention is aimed at a permanent magnetisation of at least one ferromagnetic layer in a magnetic field sensor device deposited on a chip substrate, in particular a simultaneous magnetisation of a plurality of adjacent ferromagnetic layers in two or more directions in order to thereby provide magnetic field sensor devices of high sensitivity and improved quality.

PRIOR ART

Magnetoresistive sensor devices are used for the resistance-based measurement of magnetic fields and thereby for an indirect measurement of further physical quantities such as distance, angle or current strength for example. A sensor device of this kind is based on a magnetoresistive effect, in which a change in the electrical resistance of a chip structure is brought about by applying an external magnetic field. Magnetic field sensor devices, which are based on a giant magnetoresistance effect (GMR-effect) or a tunnel magnetoresistance effect (TMR-effect), have been used more and more in recent times. These include a thin-film structure of non-magnetic and magnetic materials, in which a magnetic coupling or a spin effect influences the electrical resistance through the layers. A change of up to 5% (GMR) or up to 600% (TMR) of the electrical resistance based on an external magnetic field can be achieved in GMR and TMR-based magnetoresistive layer systems respectively. To produce TMR sensors, a layer structure of at least two ferromagnetic and one insulator layer, which constitutes a tunnel barrier, is formed so that electrons can tunnel through the insulator layer between the two ferromagnetic layers. In the case of a TMR sensor, the insulator layer is, for example, $Al_2O_3$ or MgO; in the case of a GMR-sensor, a thin conductive layer, e.g. Cu or Ru, is often used. The electrical resistance of the tunnel element depends on how the two ferromagnetic layers are magnetised with respect to one another. If the two ferromagnetic layers are magnetised parallel to one another, the resistance is minimal. If they are magnetised antiparallel to one another, the resistance is maximal. In practice, the magnetisation direction of one of the two ferromagnetic layers is often fixed (pinned) so that the magnetisation of this layer does not respond or only responds weakly to external fields. This layer is called the reference layer, or also pinned layer or permanently magnetised layer. In contrast, the other layer is formed such that its magnetisation follows the external field in a defined manner. This layer is called the detection layer or free layer. By dividing into a reference layer and a detection layer, which respond differently to external fields, it is possible to obtain changes in resistance when changing external fields and to realise a sensory device. The resistance dependency correlates with the angle between the magnetisation direction of the detection layer, which is also referred to as "freelayer", and the magnetisation direction of the reference layer, the so-called "pinned layer".

Thin-film technologies are used to produce structures of this kind. Within the framework of the production method, the direction of the magnetisation of the reference layer can be permanently set, this being often referred to as pinning. In order to pin the ferromagnetic layers, which are also referred to as reference layers, the ferromagnetic layer is normally coupled to an antiferromagnetic adjacent layer. To set the magnetisation direction, the resistance element is heated above the so-called blocking temperature, at which the exchange coupling between the antiferromagnetic layer and the ferromagnetic layer disappears, this temperature normally being less than the Curie temperature of the ferromagnetic layers. After heating above the blocking temperature and below the Curie temperature, the ferromagnetic layers are subjected to an external magnetic field which forces them into a defined magnetisation direction. This magnetisation direction is maintained when the antiferromagnetic layer cools to below the blocking temperature with the magnetic field applied.

It is highly desirable to be able to set up different pinning directions on one chip substrate individually and independently of one another, so that more than one single pinning direction can be specified. Wheatstone bridges are very useful in sensor technology in particular. Here, it is ideal when the four branches of the Wheatstone bridge are formed identically and differ only in the pinning directions.

A multiplicity of different solutions for producing pinning structures for the provision of magnetoresistive sensors is already known from the prior art. For example, DE 10 2012 208 882 describes the creation of a magnetic field planar to a chip substrate surface to enable a homogenous pinning direction to be provided on the whole chip substrate. In a similar manner, in DE 11 2009 001 140, an external magnetic field is applied parallel to the chip surface at temperatures between 200° C. and 350° C. in order to preset the ferromagnetic layers. In U.S. Pat. No. 6,501,678 B1 for example, a kind of magnetic stamp is proposed to enable complex magnetic field orientations to be provided within the chip substrate.

As an alternative to these, there are production methods in which current conductors are provided on the chip substrate surface, or deposited thereon for a short time, to enable various local magnetic fields to be generated with the help of a current flow, thus enabling a magnetisation of the ferromagnetic layers to be achieved. For example, WO 96/38738 describes the impression of a pinning current with the help of a current conductor in order to effect a magnetisation of individual layer strips. DE 195 20 206 also proposes a conductive layer to carry a set-up current in order to enable a pinning direction to be preset. Finally, U.S. Pat. No. 5,561,368 and DE 11 2010 003 705 also propose complex current-carrying elements to enable different pinning directions to be impressed on a chip substrate. Local heating by means of a laser while impressing a magnetisation direction by means of a conductor track to enable complex pinning patterns to be provided in a magnetic field sensor device is also discussed in DE 195 20 206.

A method for pinning GMR- or TMR-based resistance elements, in which first a soft magnetic structuring element as a flux concentration element is arranged in the vicinity of a resistance element, and a pinning magnetic field is coupled parallel to the chip surface so that all resistance elements equipped with a soft magnetic structuring element are pinned in an identical magnetic field direction, is described in US 2002 0180 433 A1.

A generic pinning method can be seen from U.S. Pat. No. 8,715,776 B2, wherein resistance elements separated by an insulation layer are covered or bordered by a hard magnetic layer in order to achieve alternate pinning in a magnetisation direction in the opposite polarisation. The preconditioning magnetic field is again coupled parallel to the chip substrate surface.

JP 2010 066 262 A and the parallel DE 10 2008 041 859 A relate to a magnetic field sensor arrangement for measuring a measuring magnetic field component perpendicular to a chip substrate surface, wherein a flux concentration element is provided, which, when the perpendicular magnetic field components are coupled in antiparallel to one another, generates magnetic field components in the chip substrate surface which can be detected by magnetoresistive resistance elements.

A pinning method for GMR-resistance elements is described in US 2006 0226 940, in which a chip substrate is inserted into the centre of a superconducting current coil with its chip substrate surface parallel to a magnetic field axis of the coil in order to define a pinning axis of the current coil preconditioning magnetic field parallel to the substrate surface.

A pinning method of resistance elements in two orthogonal directions is disclosed by US 2011 0151 589 A1, wherein rectangular resistance elements with a pre-defined length-width ratio are arranged in orthogonal rows on a chip substrate, and a preconditioning magnetic field aligned parallel to the chip substrate is coupled at a pinning angle of 45° to the orthogonal axes in order to pin the orthogonal resistance element rows in orthogonal directions.

The above-mentioned methods known from the prior art for local pinning of layer strips of magnetoresistive resistance structures have the disadvantage that, when an external magnetic field is applied parallel to the chip substrate surface, all resistance elements are pinned in the same direction, or, in order to provide different directions, very complex conductor structures must be applied in order to achieve a magnetisation by a pinning set-up current. If pinning conductor structures are provided, then there must be an electrical connection during the production process, so that additional process steps and therefore high costs for the production of such sensors have to be expended.

The already known production methods therefore suffer from the fact that pinning which is relatively homogenous over a large area and unidirectional can only be carried out at great expense, so that the resulting sensors have low resolution accuracy, high production costs and high production outlay.

Starting from the above-mentioned prior art, the problem is to produce magnetoresistive sensor elements of high quality and miniaturisation cost effectively. This can be achieved in that the reference layers have different pinning magnetisation directions which are easy to produce. A further object of the invention lies in providing a precise and highly integrated sensor element, which, for example, can measure magnetic fields in 2D or 3D directions on a single chip substrate.

This object is achieved by a production method and a production apparatus according to the independent claims. A magnetoresistive sensor device according to a further independent main claim can be produced therewith. Advantageous developments are described in the subsequent dependent claims.

DISCLOSURE OF THE INVENTION

According to the invention, a method for producing a magnetoresistive sensor device is proposed, in which the following steps are carried out in order to pin, i.e. permanently magnetise, at least one ferromagnetic layer in a magnetic field sensor device deposited on a chip substrate:

Production of at least one magnetoresistive resistance element on a chip substrate which comprises at least one ferromagnetic layer and at least one antiferromagnetic layer, wherein an exchange coupling, which disappears on reaching the blocking temperature, acts between ferromagnetic and antiferromagnetic layer;

Deposition of at least one soft magnetic structuring element on the chip substrate adjacent to or partially overlapping the resistance element;

Heating of the resistance element to above the blocking temperature of the material of the antiferromagnetic layer and coupling of a preconditioning magnetic field;

Cooling of the resistance element to below the blocking temperature;

Removal of the preconditioning magnetic field.

In a first step, at least one, in particular a multiplicity, of magnetoresistive resistance elements, preferably GMR- or TMR-resistance elements which have a free layer and a reference layer, is deposited on a chip substrate, wherein the reference layer consists of at least one ferromagnetic layer which is coupled to an adjacent antiferromagnetic layer by direct exchange coupling. In addition, at least one soft magnetic structuring element, for example a lithographically structured nickel-iron alloy, is deposited on the chip substrate surface adjacent to or partially overlapping the resistance elements. This can take place on the chip substrate, for example, by electrogalvanic deposition, by sputtering, by a vapour deposition method or similar measures known from chip structuring. In order to align the ferromagnetic layers, a temperature greater than the blocking temperature is applied, so that the exchange interaction between the ferromagnetic layer and the antiferromagnetic layer disappears. The ferromagnetic layer is now no longer pinned by the adjacent antiferromagnetic layer and behaves in a similar manner to the free layer. This is followed by a coupling of an external magnetic field, which is referred to below as a preconditioning magnetic field, wherein the field lines of the preconditioning magnetic field are guided by the soft magnetic structuring element such that they emerge in the resistance element at an appropriate point where they effect an adjustable magnetisation of the ferromagnetic layers based on the geometrical structure of the structuring element.

According to the invention, the preconditioning magnetic field is coupled to the structuring element perpendicular to the chip substrate surface. Angles of up to 45° to the normal of the chip substrate surface can also be assumed for the maximal component of the preconditioning magnetic field. This is followed by a cooling of the resistance element to below the blocking temperature and a removal of the preconditioning magnetic field so that the magnetisation is fixed, as a result of which pinning of the ferromagnetic layer is complete.

Optionally, before completion of the pinning operation, the soft magnetic structuring of the element can then be removed from the chip substrate, for example by etching, sputtering or similar selective material-removal methods. However, the structuring element can also remain on the chip substrate in order, for example, to be used as a conductor element, flux guiding element or similar.

Depending on the shape of the boundary of the soft magnetic structuring element, any desired alignments of a pinning magnetic field can be achieved by the stray fields of the structuring element to enable the discrete ferromagnetic layers to be pinned in individual directions. This provides the possibility of setting up arbitrary pinning directions. For pinning, the sensor element as a whole can be subjected to an external magnetic field (=preconditioning magnetic field) which is as homogenous as possible, wherein individual local magnetisation directions can be set by virtue of the poles or boundary edges of the structuring element. The structuring element can be removed after impressing the pinning magnetic field and can preferably consist of nickel iron. An insulating layer, for example SiN with a relatively small thickness of 30 nm to 5 μm, can be provided between the resistance elements and structuring element.

Due to the lithographic production method, the structuring element can have any extension surface and any structuring of the boundary surface from which the pinning stray magnetic field emerges. Different pinning directions of a Wheatstone measuring bridge structure can therefore be preset in a single process step. As a result, it is possible to build up resistance elements of the Wheatstone measuring bridge, for example interdigitally and spatially adjacent to one another, so that material inhomogeneities on the chip structure compensate for one another due to the spatially close arrangement of corresponding resistance elements of a measuring structure. In practice, this compensates for temperature-dependent faults or material faults and enables an increased accuracy. A single structuring element can be formed in such a way that it can pin two or more TMR- or GMR-resistance elements simultaneously.

According to the invention, the soft magnetic structuring element is arranged such that the preconditioning magnetic field is coupled in the structuring element perpendicular to the chip surface and, at the location of the resistance element, also generates magnetic field components parallel to the chip surface which penetrate the ferromagnetic layer of the resistance element at least in some areas. The preconditioning magnetic field can therefore be a homogenous magnetic field which occurs perpendicular to the chip substrate surface and which, due to the magnetic field guiding characteristic and the geometric design of the structuring element, also emerges at boundary edges in the form of a stray field parallel to the chip surface and carries out a pinning of the adjacent resistance elements. This enables any desired pinning directions to be provided in the resistance element, as a result of which a single structuring element can pin a plurality of resistance elements simultaneously.

In an advantageous development, two or more resistance elements can be associated with the soft magnetic structuring element in order to carry out a magnetisation of the at least one ferromagnetic layer of the resistance elements in the same direction parallel to the chip substrate surface. Alternatively, two or more resistance elements can be associated with the soft magnetic structuring element in order to carry out a magnetisation of the at least one ferromagnetic layer of the resistance elements in opposite directions parallel to the chip substrate surface. Two or more resistance elements can therefore be associated with a structuring element simultaneously, wherein a pinning in the same direction or in different, in particular antiparallel, directions is enabled by forming magnetic poles of the structuring element. Two opposing poles of the structuring element can therefore effect a 180° emergence of stray magnetic field lines, thus enabling a simultaneous pinning of two resistance elements, which are associated with a lower or upper half-bridge of a Wheatstone measuring bridge, for example. As the opposing pinned resistance elements are spatially adjacent, a temperature drift or a material fault in the chip substrate gives rise to identical resistance changes so that these compensate for one another in the measuring bridge, as a result of which the bridge offset is minimised. An offset minimisation brings about increased accuracy of the magnetic field sensor measuring bridge. Particularly in the case of TMR-resistance elements, the homogeneity of the tunnel barrier is a weakness in the production method. As the layer thickness of the tunnel barrier is included exponentially in the resistance of the tunnel element, in a Wheatstone bridge tiny changes in the layer thickness give rise to relatively large offset values of the bridge. In order to minimise this offset problem, it is advantageous to arrange the two bridge branches spatially as close as possible, as, due to the spatial proximity, the variations in the barrier thickness are lowest and the bridge branches have structural characteristics which are as similar as possible.

Advantageously, the set magnetisation direction of the ferromagnetic layers of the resistance elements can lie parallel or antiparallel to one another depending on the shape of the contour of the structuring elements and the spatial position of the resistance elements with respect to the structuring element.

In an advantageous embodiment, the at least two or more resistance elements can be used to form a Wheatstone measuring bridge, preferably to form at least one upper or lower bridge arm of a Wheatstone measuring bridge. For this purpose, in particular, it is convenient to use one structuring element for pinning the upper and one structuring element for pinning the lower bridge arm, or to provide a common structuring element with differently formed poles for simultaneously pinning the resistance elements of the upper and the lower bridge arm. Preferably, the resistance elements which form the upper bridge arm and the resistance elements which form the lower bridge arm are arranged spatially next one another on the chip substrate.

Advantageously, the resistance elements are aligned in such a way that they form a GMR-layer system. A GMR-layer system (giant magnetoresistance layer system) means a structure which consists of at least two ferromagnetic layers which are separated by a non-magnetic metal layer. An indirect exchange coupling, the so-called RKKY interaction coupling, acts between the two ferromagnetic layers. The resistance of the GMR-resistance element depends on the angle between the magnetisation directions of the ferromagnetic layers.

Alternatively, the magnetic field sensor device can also include resistance elements which form a tunnel resistance layer system (TMR-layer system). A TMR-system is based on a thin insulator with a layer thickness of 0.5 to 3 nm being provided between two ferromagnetic layers so that the electrons can tunnel between the ferromagnetic layers. The proposed production method can therefore be used particularly easily and cost effectively for the production of GMR- or TMR-magnetic field sensors. This enables magnetic field sensor devices to be produced for a compass application or for a distance measuring device, angle measuring device or similar.

In an advantageous development, at least one boundary edge of the soft magnetic structuring element can run substantially parallel or tangential to a boundary edge of a resistance element, wherein the resistance element is overlapped at least in some areas by the soft magnetic structuring element or is encom-passed thereby, and wherein the overlapping has a magnitude of 5 μm or less. It is therefore proposed to provide at least one boundary edge of the soft magsnetic structuring element parallel or tangential to a contour of the resistance element so that magnetic fields which are guided by the structuring element and emerge at the boundary edges enter the resistance element directly and can therefore give rise to a high pinning effect of the ferromagnetic layer. This enables a coupling of the pinning magnetic field from the structuring element into the resistance element to be improved, and a reliable alignment of the ferromagnetic layer to be achieved.

In an advantageous development, the preconditioning magnetic field can penetrate the chip substrate substantially perpendicular to the chip substrate surface, wherein magnetic stray fields in the region of the boundary edge of a soft magnetic structuring element are aligned substantially parallel to the chip substrate surface or have a sufficiently strong component parallel to the chip substrate surface. The magnetic field lines can therefore also be aligned at an angle of up to 45° to the chip substrate surface. It is proposed that the preconditioning magnetic field can be aligned by the structuring elements perpendicular to the chip substrate, wherein, in the region of the boundary edges, magnetic stray fields scatter parallel to the chip substrate, and wherein the magnetic opposite pole is arranged below the chip substrate so that the stray fields only have a locally limited effect and are guided through the chip substrate onto the opposite pole of the magnetic field generating device. In this way, many differently aligned stray fields can be generated closely adjacent to one another by the structuring element to enable different pinning directions to be provided in high density on the chip.

According to an advantageous development, the soft magnetic structuring element can be formed in such a way that the flux density of the emerging magnetis stray fields is preferably guided and amplified by salient pole shoes or flux guiding cut-outs in the structuring element. It is proposed that the structuring element be formed along the boundary edges and also on the surface facing the chip substrate surface in such a way that salient pole shoes are formed or flux guiding cut-outs, such as edges, steps or roundings, are provided in order to specifically guide and bundle the magnetic fields within the soft magnetic structuring element to enable a high stray field to emerge at the required boundary edges. This makes relatively high pinning magnetic field strengths possible at the boundary edges and achieves a reliable pinning with high and consistent quality.

In an advantageous development, the resistance elements can be insulated from the soft magnetic structuring element by an insulation layer, in particular by a layer of SiN or $Al_2O_3$ with a thickness of 30 nm to 5 μm. As a result of an intermediate insulation layer between chip substrate, in particular resistance elements, and the structuring element, the deposition of the structuring element is simplified and, in particular, the structuring element can be easily removed when pinning is complete without damaging the resistance elements or the chip substrate. This prevents contamination and damage on the chip substrate. A layer of SiN or $Al_2O_3$ with a relatively small thickness of 30 nm to 5 μm, maximum up to 10 μm, can be easily deposited and protects the magnetic field sensor chip before and during the deposition and when removing the soft magnetic structuring elements.

In an advantageous development, the soft magnetic structuring element can be produced by depositing or building up a layer of soft magnetic material on the chip substrate, in particular NiFe with a layer thickness of 1000 nm to 20 μm, preferably by an electrogalvanic or gas deposition method and a lithographic structuring method for structuring individual soft magnetic structuring bodies. In electroplating, a seed layer, on which a photo structure is deposited, is normally deposited first. After this, the structuring bodies are deposited by means of a galvanisation layer and the seed layer is then removed. It is proposed that the structuring element be deposited by depositing NiFe with a layer thickness of 1000 nm to 20 μm, in particular deposited by means of a lithographic structuring method and electrogalvanic deposition or gas deposition. Here, after deposition over a large area, lithographic structuring can be carried out in order to form individual structuring bodies and, for example, to form defined pole shoes or similar and a required shape of the boundary contour of the structuring element. This enables the use of proven techniques for depositing the structuring elements, which can be easily integrated into an already existing production process without higher costs and without major time expenditure.

Advantageously, on completion of the pinning process, the soft magnetic structuring element can be removed from the chip substrate. The structuring elements are then only used as a production and sacrificial layer, which can subsequently be removed without leaving a residue after coupling the pinning magnetic field. There are therefore no restrictions on the sensor structure, and the design and shape of the magnetic field sensor structures can be chosen regardless of a shape of the coupling structuring elements. The shape of the structuring elements can therefore be optimally chosen for the coupling process of the pinning magnetic field without having to make compromises with regard to a further use of the structuring elements.

In a coordinated aspect, the invention relates to a magnetic field preconditioning apparatus for the magnetic preconditioning of resistance elements of a field sensor device deposited on a chip substrate. The magnetic field preconditioning apparatus comprises an oven and a magnetic field generating device having a pole and an opposite pole surface in the interior of the oven, wherein at least one chip substrate of at least one soft magnetic structuring element can be placed between pole and opposite pole surface in order to achieve a magnetic preconditioning, in particular pinning, of resistance elements arranged on the chip substrate by a preconditioning magnetic field which is aligned perpendicular to the chip substrate surface. Preferably, a plurality of chip substrates or wafers is pinned simultaneously. The oven is suitable for setting a temperature above the blocking temperature but below the Curie temperature of the individual layer strips of the resistance elements, and to achieve pinning by impressing an external preconditioning magnetic field. Deposition of the resistance elements on the chip substrate surface is followed by heating and pinning within the magnetic field preconditioning apparatus. The preconditioning magnetic field can be applied during the whole heating and cooling process or can be selectively switched on on reaching a pre-defined temperature and switched off on falling below a further pre-defined temperature. Alternatively, the chip substrate or the wafer to be pinned can be removed from the magnetic field device in order to remove the external pinning magnetic field. This can be followed by a removal of the structuring elements, and the completion of the magnetic field sensor device is carried out in further process steps.

In an advantageous development, the magnetic field generating device can comprise a permanent magnet which is arranged in the oven, wherein a strength of the preconditioning magnetic field can be set by means of an adjustable air gap between permanent magnet and pole and opposite pole surface by means of an air gap adjustment device. If the preconditioning magnetic field is provided by a permanent magnet, then a magnetic field generating device of this kind can be used in any oven without having to provide an additional power supply. In this case, the strength of the magnetic field can be set by adjusting an air gap with the help of an air gap adjustment device in order to set the strength of the preconditioning magnetic field. The magnetic field is permanently applied during the heating and cooling process and the strength thereof can be varied, for example by changing an air gap. The pre-manufactured chip substrate with soft magnetic structuring elements is placed between the pole and the opposite pole surface, wherein the oven is heated to a temperature above the blocking temperature of the antiferromagnetic layers and remains below the Curie temperature of the ferromagnetic layers so that reliable pinning of the magnetic field sensor device can be achieved.

Finally, in a further coordinated aspect of the invention, a magnetic field sensor device for detecting at least one component of an external magnetic field, which includes at least one magnetoresistive resistance element, is proposed. The magnetic field sensor device is produced in accordance with one of the aforementioned possible embodiments of the production method.

BRIEF DESCRIPTION OF THE DRAWINGS

Further advantages can be seen from the presented descriptions of the drawings. Exemplary embodiments of the invention are shown in the drawings. The drawings, the description and the claims contain numerous characteristics in combination. Expediently, the person skilled in the art will also consider the features singly and combine them to form meaningful further combinations.

In the drawings:

FIG. 8 shows, in a side view, schematically, a pinning step according to different embodiments of the invention;

DETAILED DESCRIPTION OF THE PREFERRED EMBODIMENTS

In the figures, the same elements are numbered with the same references.

Figure 1A:
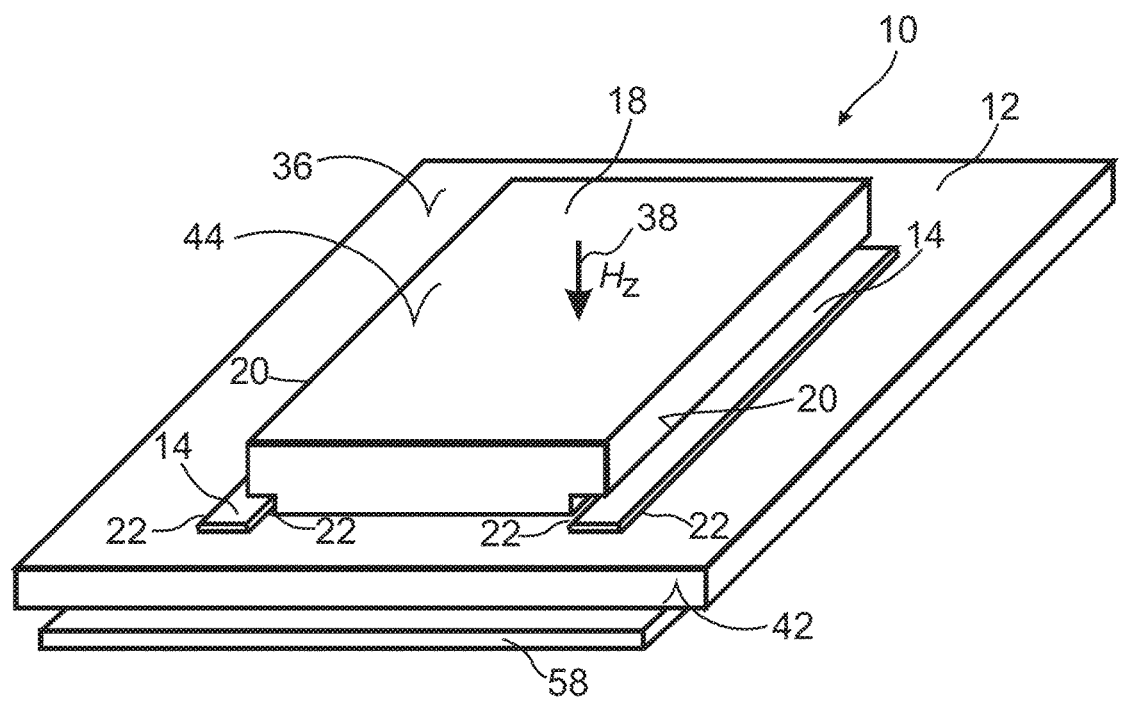
FIG. 1a shows, in a perspective view, a first embodiment of a production step according to the production method according to the invention.

A perspective, schematic diagram for pinning resistance elements 14 of a magnetic field sensor device 10 is shown in FIG. 1. The magnetic field sensor device 10 comprises a chip substrate 12 on which resistance elements 14 are arranged. The resistance elements 14 consist of a multiplicity of single thin ferromagnetic and antiferromagnetic layers which are stacked on top of one another and which can be connected to form a Wheatstone measuring bridge. A preconditioning magnetic field $H_Z$ 38, which is aligned perpendicular to the surface 36 of the chip substrate 12, is used for the magnetic pre-alignment, the so-called pinning, of the ferromagnetic layers of the resistance element 14. The preconditioning magnetic field $H_Z$ 38 is transmitted by a magnetic pole (not shown), penetrates the chip substrate 12, and is absorbed once more by an opposite pole surface 58, which is arranged beneath the chip substrate 12. The preconditioning magnetic field $H_Z$ 38 penetrates a soft magnetic structuring element 18 perpendicularly, wherein it is aligned at right angles to the structuring layer surface 44. The structuring element 18 guides the preconditioning magnetic field 38 so that, owing to a distance from the chip substrate and to an increased magnetic conductivity through the resistance elements 14, it emerges at boundary edges 20 parallel to the chip surface 36 and penetrates the resistance elements 14. An improved penetration of the resistance elements 14 is achieved particularly in that a temperature above the blocking temperature of the antiferromagnetic layers of the resistance element is set, thus enabling an improved flux guidance through the resistance elements 14 to occur. The boundary edges 20 of the structuring element 18 overlap the boundary edges 22 of the resistance elements 14.

Figure 1B:
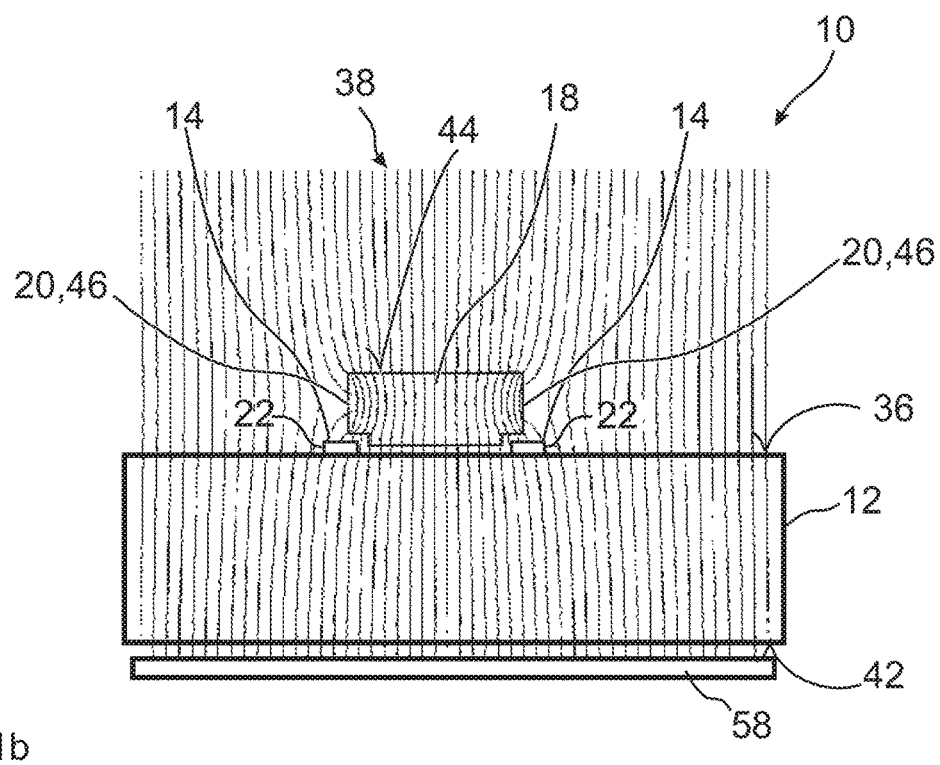
FIG. 1b shows a magnetic stray field for pinning a resistance structure according to a production step of the method according to the invention.

FIG. 1b shows a corresponding magnetic field sectional diagram, wherein the magnetic flux scatter at the boundary edges 20 and the corresponding stray magnetic field 46 of the structuring element 18, which is influenced by the resistance elements 14, is shown. It can be clearly seen that the boundary edges 20 of the structuring element 18 overlap the boundary edges 22 of the resistance element 14. The whole width of the resistance element 14 is therefore permeated by magnetic fields, which also have a component in the chip plane. Finally, the magnetic field lines are steered through the chip substrate 12 to the opposite pole surface 58, thus enabling different pinning magnetic field directions to be set up depending on the alignment of the boundary edges 20 of the structuring elements 18 on the chip substrate 12.

Figure 2C:
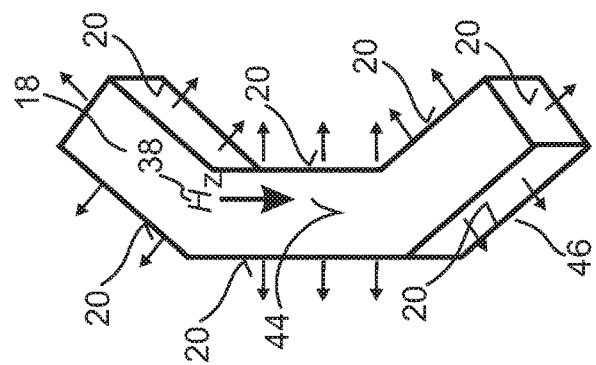
FIG. 2 shows different views of soft magnetic structuring elements for use in an embodiment of the method according to the invention.
Figure 2B:
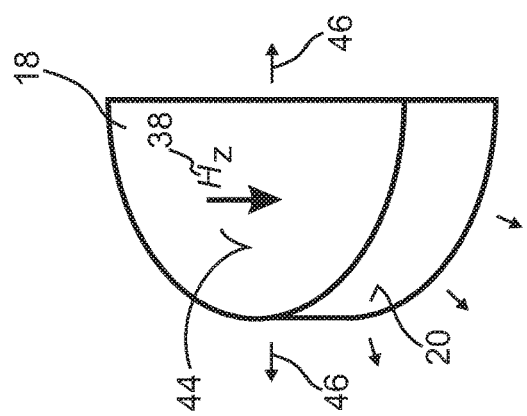
Figure 2A:
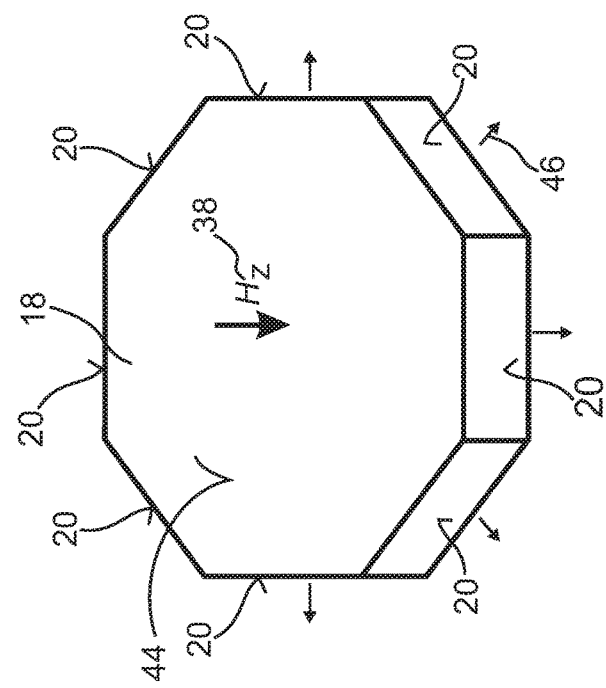

Different further embodiments of possible soft magnetic structuring elements 18 are shown in perspective in FIG. 2a to 2c. These are implemented, for example, as octagonal layer strips according to FIG. 2a, as semicircular layer strips according to FIG. 2b or as angled layer strips according to FIG. 2c. Structuring elements 18 can have a multiplicity of boundary edges 20 which are angled or bent with respect to one another in the form of a polygon. The preconditioning magnetic field $H_Z$ 38 lies perpendicular to the structuring layer surface 44, wherein stray magnetic fields 46 normal to the boundary surface 20 of the structuring elements 18 emerge substantially parallel to the chip substrate surface. This enables any desired pinning directions to be set for producing a magnetic field sensor device 10.

Figure 3:
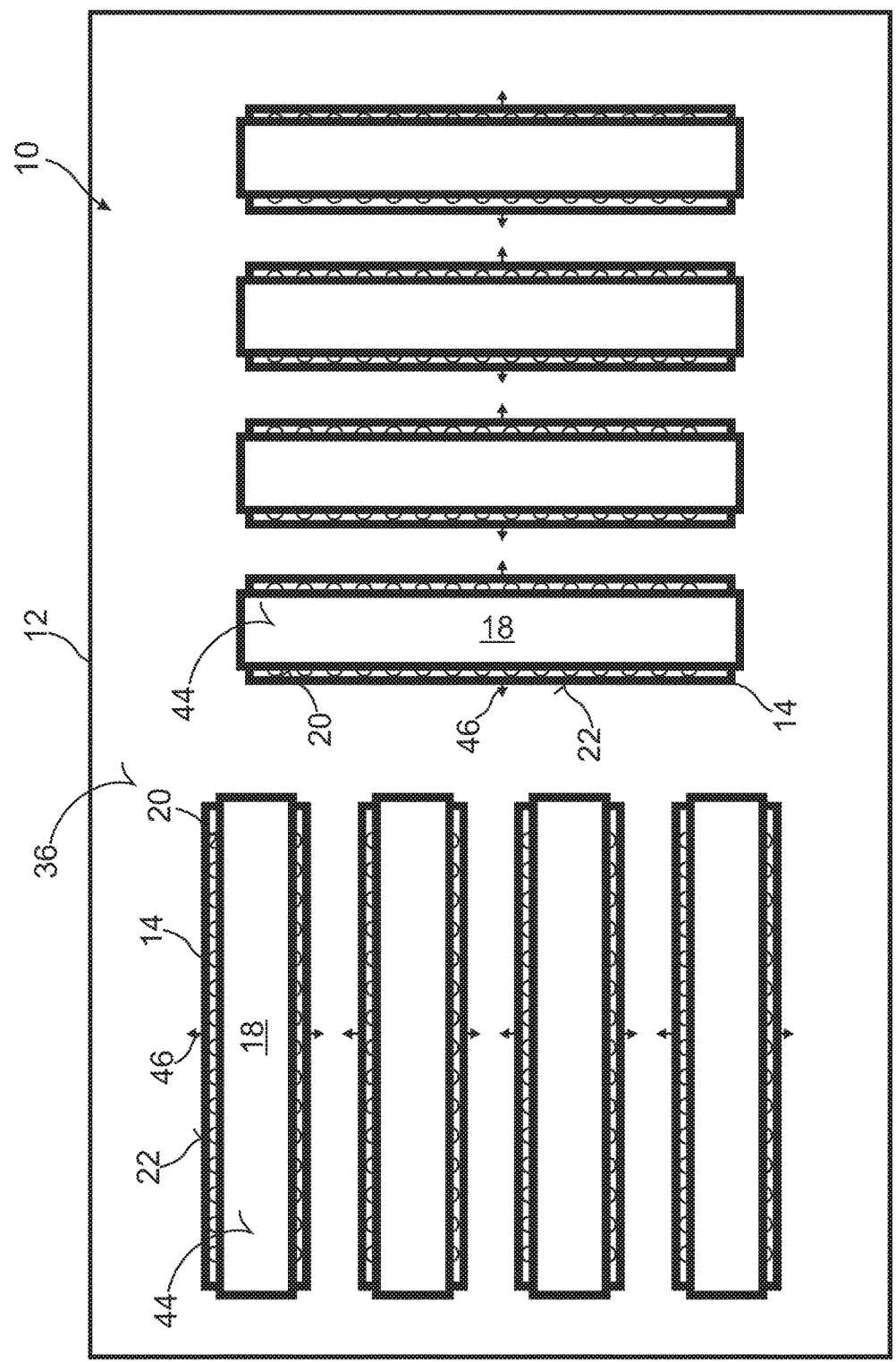
FIG. 3 shows a chip structure with soft magnetic structuring elements for producing a measuring device according to the invention.

The production of two complex Wheatstone measuring bridges for measuring two orthogonal magnetic field components X and Y of a magnetic field sensor device 10 is shown in FIGS. 3 and 4. The pinning step of a magnetic field sensor device 10 is shown in FIG. 3, wherein a multiplicity of resistance elements 14, e.g. TMR-resistance elements, is arranged on a chip substrate surface 36 of a chip substrate 12. Soft magnetic structuring elements 18, the boundary edges 20 of which at least partially overlap the boundary edges 22 of the resistance elements 14, are deposited partially overlapping the boundary edges 22 of the resistance elements 14. By applying a preconditioning magnetic field aligned perpendicular to the chip substrate surface 36, boundary edge stray fields 46 of the structuring elements 18 are generated, as shown by the small arrows, and pin the resistance elements 14.

Figure 4A:
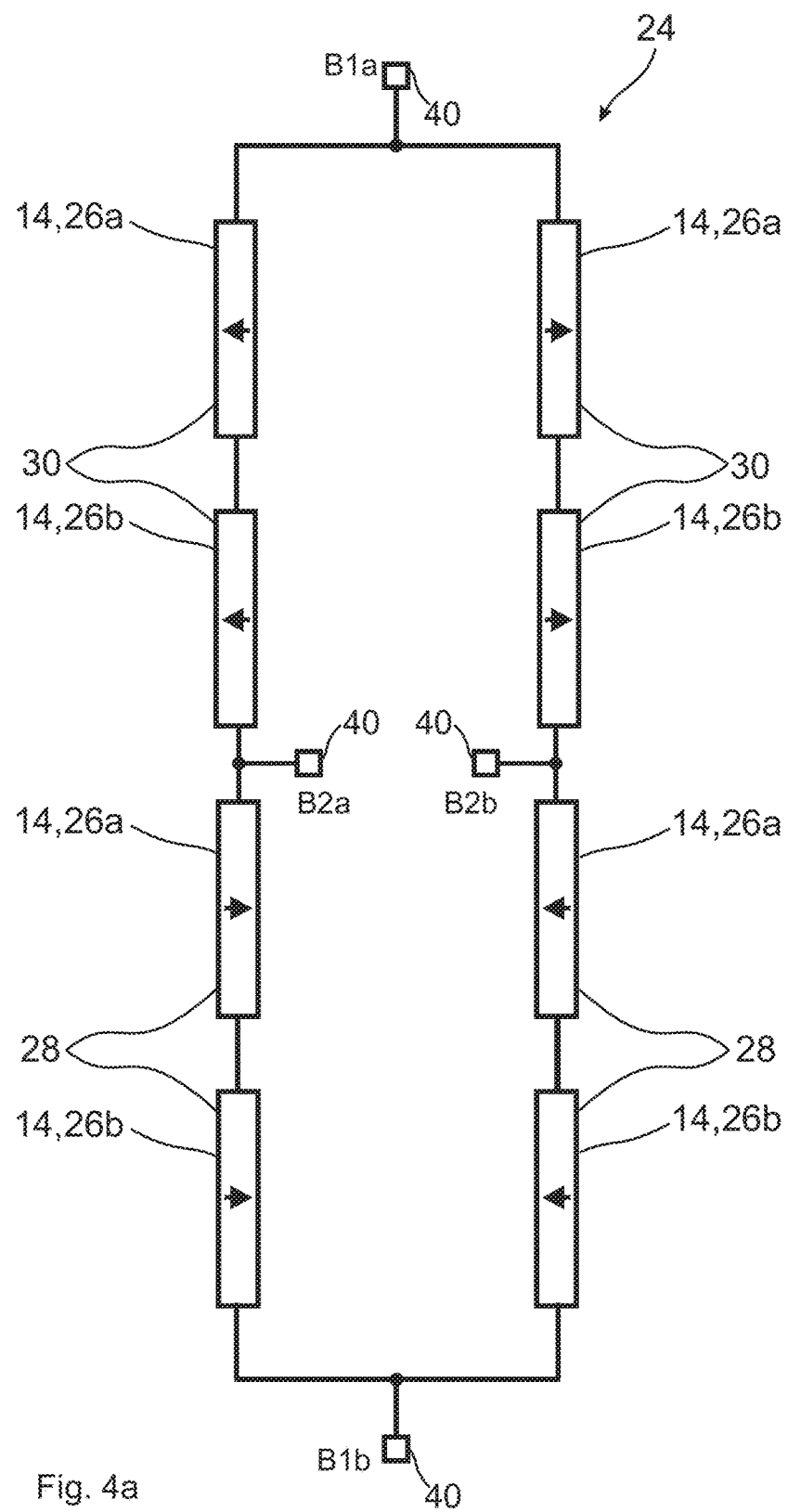
FIG. 4 shows a schematic circuit diagram and chip structure of an embodiment of a measuring device according to the invention.

A circuit diagram of one of the two Wheatstone measuring bridges of the magnetic field sensor device according to FIG. 3 is shown in FIG. 4a. The Wheatstone measuring bridge 24 consists of four individual bridge resistances 26, wherein each bridge resistance 26 consists of two resistance elements 14, and therefore each bridge resistance 26 is in each case made up of a bridge resistance element 26a and 26b which are connected in series. The resistance elements 26a and 26b are pinned in the same direction. A current can be fed into the measuring bridge 24 by means of supply pins B1a and B1b 40. The bridge resistances 26 of the upper measuring bridge 30 of the two bridge arms are pinned in the opposite direction. The same applies to the bridge resistances 26 of the lower measuring bridge 28. The bridge resistances 26 of the upper measuring bridge 30 and of the lower measuring bridge 28 are likewise pinned in the opposite sense with respect to one another. By applying an external magnetic field, the corresponding resistance values of the bridge resistances of the upper and lower measuring bridge are affected in such a way that a significant voltage difference occurs at the measuring contacts B2a, B2b 40, the resistance change of which enables the magnitude and/or angle of an external magnetic field to be inferred. As shown in FIG. 3, two sets of resistance elements 14, which are connected to the bridge resistances 26, are arranged on one plane of the chip substrate 12, wherein, for a 2D measurement, resistance elements 14 are provided for two measuring bridges 24, which are arranged at 90° to one another.

Figure 4B:
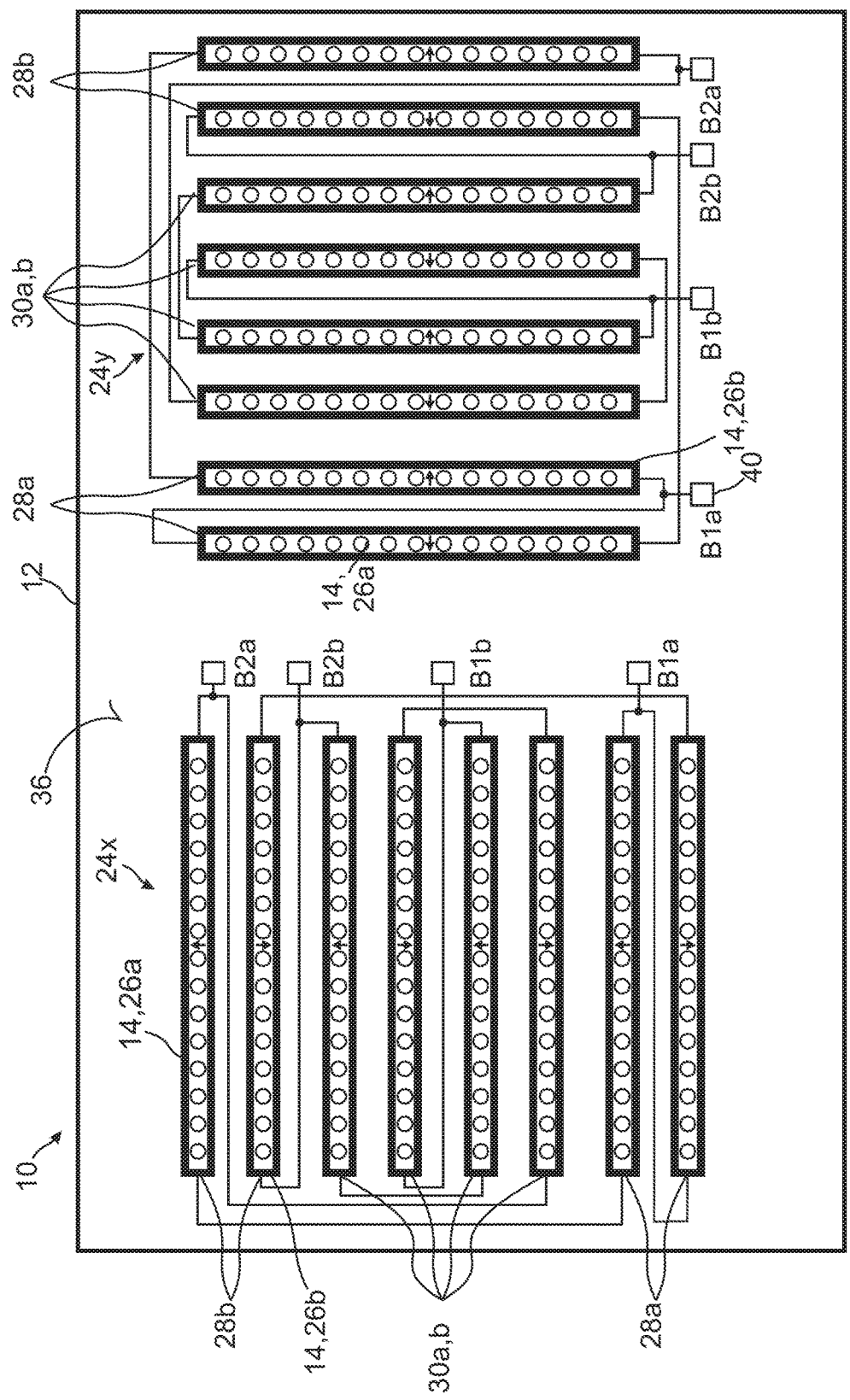

FIG. 4b shows the circuit configuration as shown schematically in FIG. 4a after removal of the soft magnetic structuring elements 18 and electrical connection of the individual resistance elements 14. Two measuring bridges 24x and 24y, which can be pinned in the X- and Y-direction by means of a uniform preconditioning magnetic field, are arranged on a common chip substrate 12. For this purpose, as shown in FIG. 3, a multiplicity of soft magnetic structuring elements 18 is provided, which in each case can pin two adjacent resistance elements 26a, 26b in opposite senses and which are offset by 90° with respect to one another for the two measuring bridges 24x, 24y. A common pinning process by arranging soft magnetic structuring elements and introducing a homogenous preconditioning magnetic field enables reliable pinning to be achieved very easily, wherein the associated resistance elements 14 of the measuring bridge 26 are spatially adjacent to enable temperature drifts or inhomogeneities in the chip substrate to mutually compensate for one another. As a result, high-precision bridge circuits, which can only accommodate a small drift and a highly sensitive resistance change on application of two-dimensional magnetic fields, can be provided.

The two Wheatstone measuring bridges shown for a 2D magnetic field sensor device can be used for an angle sensor. By coupling the preconditioning magnetic field 38 out-of-plane, i.e. perpendicular to the chip substrate surface 36, complex pinning directions can be preset. With a 360°-rotation of an external magnetic field in-plane, the two Wheatstone measuring bridges produce a si-nusoidal output signal. As a result of the different pinning directions, sine and cosine signals, phase-shifted by 90°, are generated in the two measuring bridges 24x and 24y. As shown in FIGS. 2a-2c, the structuring elements 18 can have any geometrical shape and do not necessarily have to provide pinning directions which are offset with respect to one another by 90° or 180°.

Figure 5:
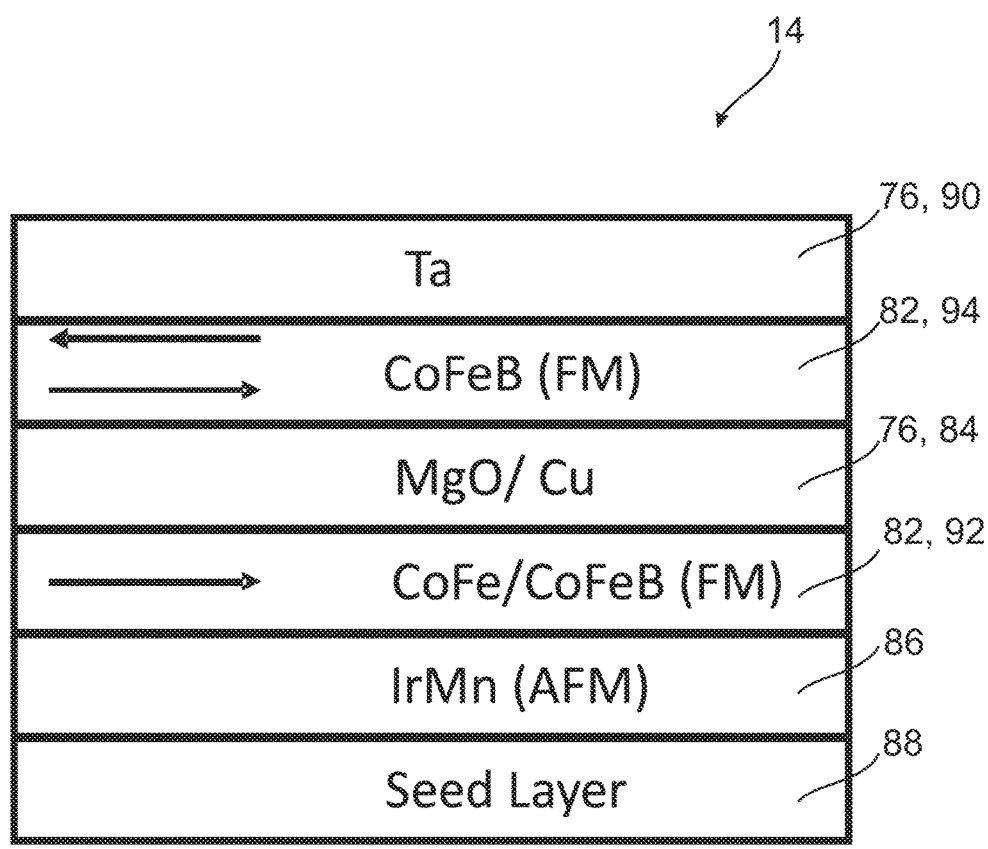
FIG. 5 shows a diagram of an exemplary layer structure which is advantageous for the method.

Examples of layer stacks of a resistance element 14, the layer structure of which is suitable particularly for the setting according to the invention of the magnetisation direction of the so-called simple-spin-valve reference layer, are shown in FIG. 5. The pinned layer, which consists solely of an antiferromagnetic layer (AFM) 86 with coupled ferromagnetic layer (FM) 82 as reference layer 92, is deposited on a starting layer (seedlayer) 88, which can also serve as an electrical contact layer. Situated above this, depending on the MR technology, s is either a thin metallic non-magnetic intermediate layer, e.g. Cu (GMR) 84 or a thin insulating layer, e.g. MgO (TMR) 76. Above this is arranged the free ferromagnetic layer (FN) 82 as a detection layer 94, which is finally covered by a protective layer 90, e.g. Ta.

In order to set the magnetisation direction, the layer stack of the resistance element 14 is heated to above the blocking temperature at which the exchange coupling between the antiferromagnetic layer 86 and the reference layer 92 disappears, and the layer stack is subjected to an external preconditioning magnetic field. As a result of the structuring elements 18 (not shown here), magnetic field components, which set the required magnetisation in the reference layer 92, are generated parallel to the layer planes. After cooling the layer stack to below the blocking temperature, the coupling of the reference layer 92 with the antiferromagnetic layer 86 is reinstated, and a stable magnetisation is retained in the reference layer 92 even after the preconditioning magnetic field has been switched off. The pinning serves to set the magnetisation of the reference layer 92.

Figure 6:
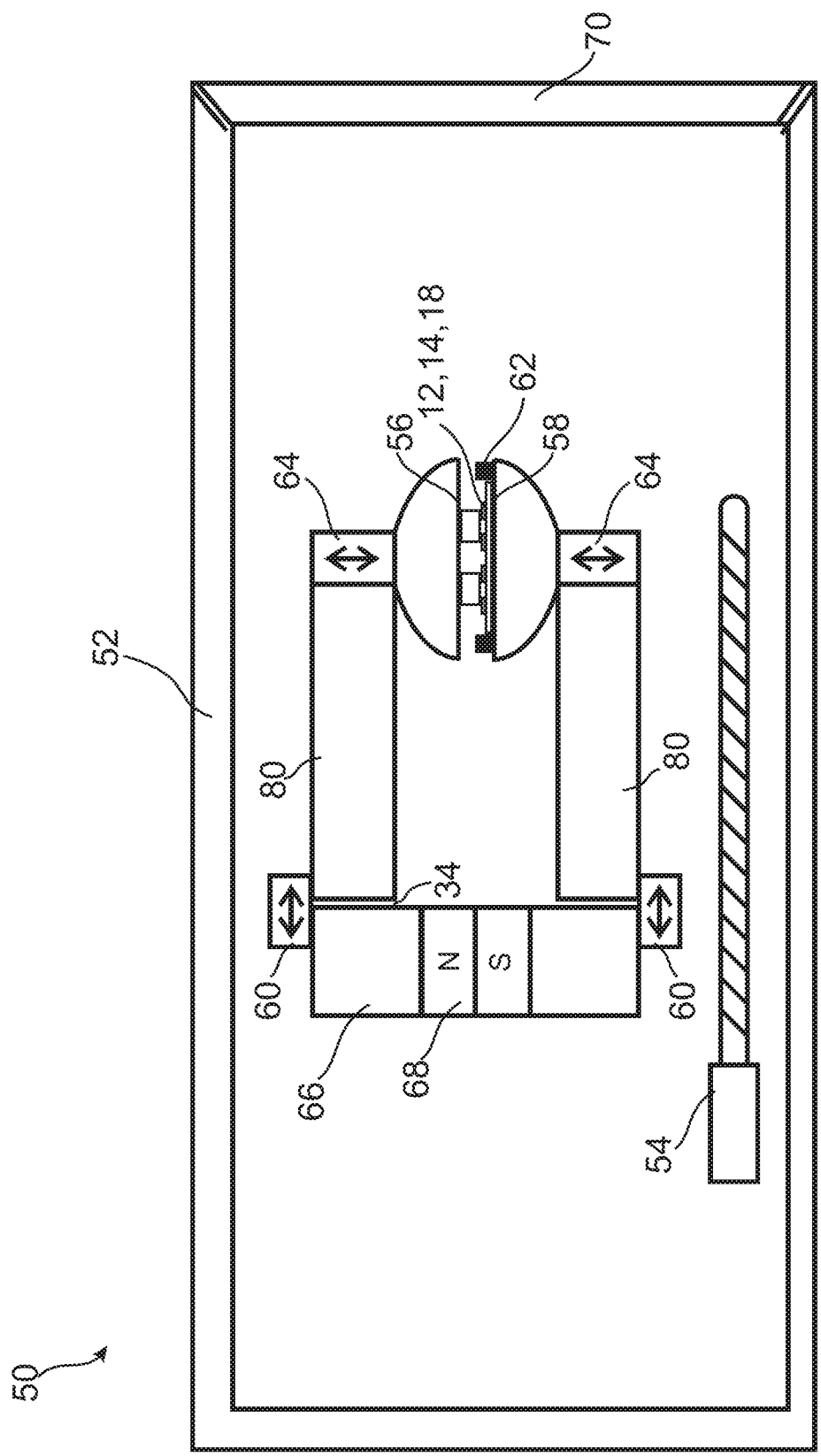
FIG. 6 shows, schematically, an embodiment of a magnetic field preconditioning apparatus according to an exemplary embodiment of the invention.

A magnetic field preconditioning apparatus 50, which comprises an oven 52 and a magnetic field generating device 66, is shown in FIG. 6. The oven 52 has a door 70, which can be opened and closed, and through which the whole magnetic field generating device 66 can be removed. By means of a heating device 54, which can be operated electrically for example, the interior of the oven can be heated to a temperature above the blocking temperature, preferably above 200° C. The magnetic field generating device 66 comprises a permanent magnet 68 which, by means of a magnet yoke, consists of individual ferromagnetic components which lead to a pole surface 56 and an opposite pole surface 58. The magnetic field of the permanent magnet 68 is guided through an iron yoke 80 and penetrates the air gap between pole surface 56 and opposite pole surface 58. To regulate the strength of the preconditioning magnetic field 38, an air gap adjustment device 60 is provided, by means of which a variable air gap 34 can be set in the iron yoke 80 to enable thereby the strength of the preconditioning magnetic field 38, which is established between pole and opposite pole surface 56, 58, to be varied. A pole spacing adjustment device 64, which serves for a reliable guidance of the preconditioning magnetic field 38 in the soft magnetic structuring elements 18, is provided for improved magnetic contact of a magnetic field sensor device on a chip substrate 12 with resistance elements 14 and soft magnetic structuring elements 18.

Figure 7:
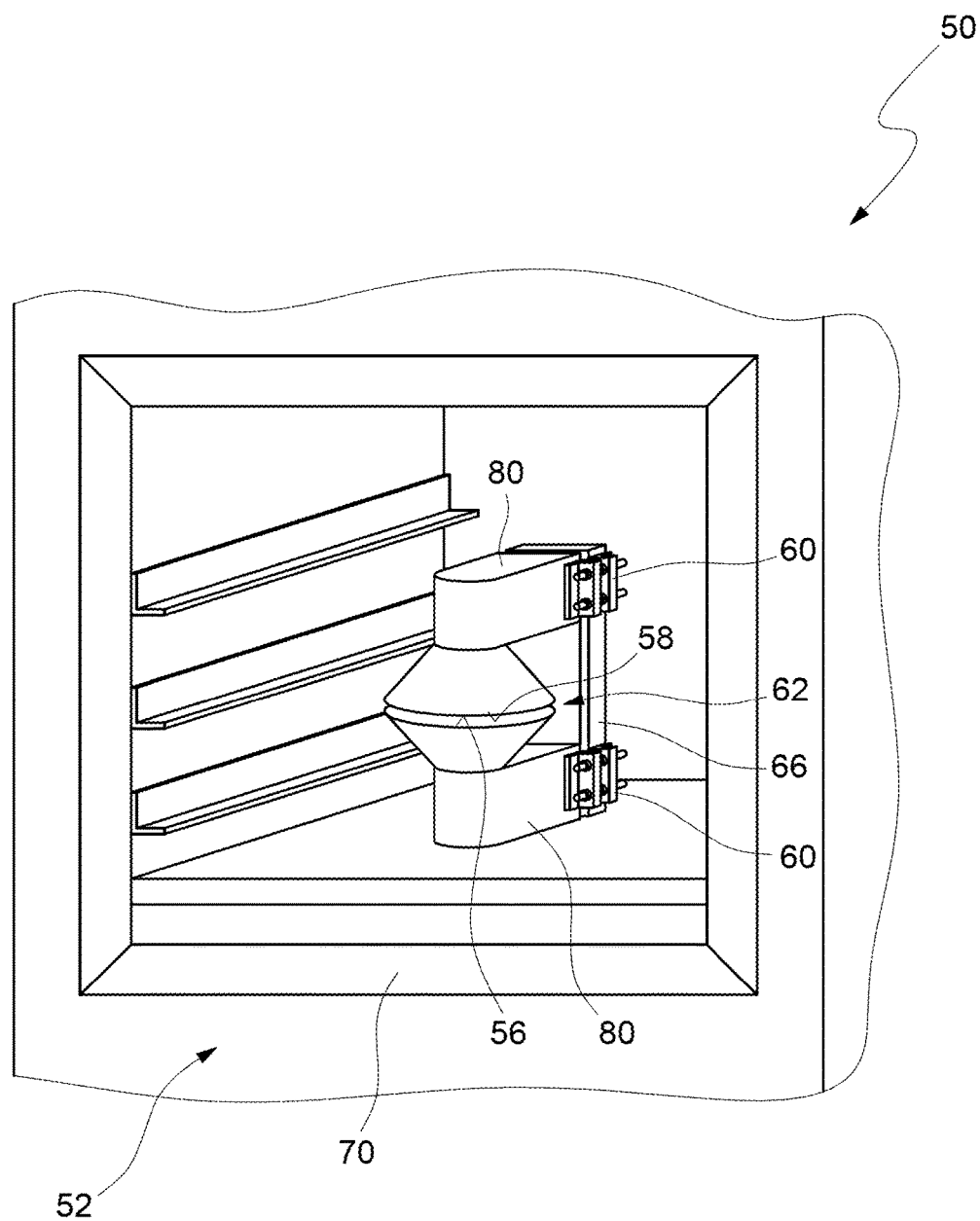
FIG. 7 shows, in perspective, an embodiment of a magnetic preconditioning apparatus according to the invention.

An exemplary embodiment of a magnetic field preconditioning apparatus 50 shown schematically in FIG. 6 is shown in perspective in conjunction with an oven 52 in FIG. 7. The coupling of the pinning magnetic field within the framework of a production method of a magnetic field sensor device 10 is shown schematically in side views in FIGS. 8a to 8c. The magnetic field sensor device 10 comprises a chip substrate 12, in which resistance elements 14 are deposited as TMR-stacks with a multiplicity of thin ferromagnetic and antiferromagnetic layers. Each resistance element 14 comprises a contact layer 88 for feeding in electrical current, an antiferromagnetic layer 86 and two ferromagnetic layers 82, a reference layer 92 immediately adjacent to the layer 86, and a detection layer 94 which is isolated from the reference layer 92 by a non-magnetic layer 84. A preconditioning magnetic field 38 penetrates a structuring element 18 perpendicularly via the surface 44, wherein the structuring element 18 effects a guidance of the magnetic flux 78 so that a stray magnetic field 46, which penetrates the resistance elements 14 and effects the magnetic alignment of the ferromagnetic layers 82, in particular of the reference layer 92, emerges through boundary edges 20. The surface 44 can be planar, curved or formed in other ways. Lower and upper contact layers for making electrical contact with the resistance layers 14 may already have been arranged at this stage.

In FIG. 8a, the structuring element 18 is U-shaped and has a flux guiding cut-out 74, by means of which the magnetic flux 78 is deflected and thereby guided in a concentrated manner. By this means, the magnetic flux 78 is fed to the boundary edges 20 to a greater extent and emerges as stray flux 46. In the diagram of FIG. 8, the magnetic flux 78 is shown only schematically and in simplified form in order to illustrate the principle of operation which is basically to be achieved. The dimensions and flux paths shown serve only to illustrate the basic principle.

In FIG. 8b, the structuring element 18 is formed in such a way that dedicated pole shoes 72 are formed, which effect a guidance of the stray field 46 into the adjacent vicinity of the resistance element 14 and give rise to an increased concentration of the stray field 46 in order to achieve complete pinning of the ferromagnetic layers 82, in particular of the reference layer 92.

Finally, the structuring element 18 is structured in a complex manner in FIG. 8c; it has a flux guiding cut-out 74 and overlapping pole shoe edges 72 in order to achieve an improved coupling of the flux guidance 78 in the interior of the resistance element 14.

Figure 9:
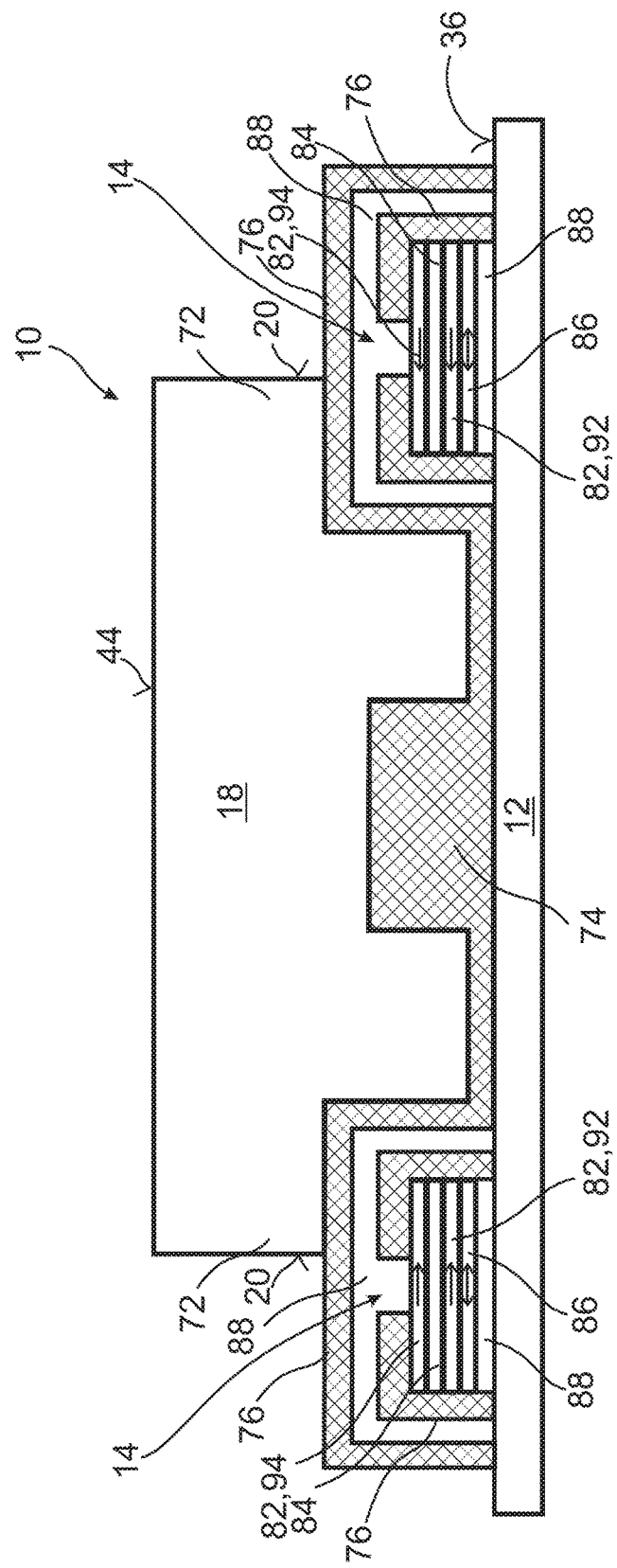
FIG. 9 shows a sectional view of a structuring setup after depositing a soft magnetic structuring element within the framework of an embodiment of the method according to the invention.

An exemplary embodiment of a production method according to the invention is shown in a sectional view in FIG. 9. A soft magnetic structuring element 18 is arranged on a chip substrate 12, wherein it is separated from resistance elements 14 by an insulating layer 76. The resistance elements 14 consist of a layer stack of ferromagnetic layers 82, which serve as reference and detection layer 92, 94, a non-magnetic intermediate layer 84, and an antiferromagnet 86, which are connected to contact layers 88. Above this is the insulation layer 76, on top of which a structuring element 18 is deposited. The structuring element 18 has a flux guiding cut-out 74 and pole shoes 72 in order to achieve a guidance of the resulting pinning magnetic field in the resistance elements 14. By applying a magnetic field aligned perpendicular to the chip surface 36, stray field lines are introduced via the pole shoes 72 of the structuring element 18 into the resistance elements 14 in order to align the ferromagnetic layers 82, in particular the reference layer 92. After pinning, the structuring element 18 can be removed, for example by etching or by another removal method, and the production of the magnetic sensor device 10 completed.

The effective pinning magnetic field at the location of the reference layer can only have a low strength of typically 100 mT or less, which, however, is sufficient for pinning a simple-spin-valve layer structure. However, a synthetic antiferromagnet of this kind in the reference layer usually requires considerably higher fields for pinning and cannot be pinned by weak fields of this kind. A synthetic antiferromagnet is understood to mean a layer structure in which 2 or more ferromagnetic layers are separated by a thin non-magnetic intermediate layer, wherein an exchange coupling for aligning the magnetisation in the ferromagnetic layers acts between the ferromagnetic layers. A synthetic antiferromagnet therefore comprises a series of at least two thin layers of magnetic and non-magnetic conducting material, e.g. Co and Cu, the thin magnetic layers of which are magnetised in an alternating manner and therefore do not generate a resulting external magnetic field. However, by using a non-balanced, i.e. having different ferromagnetic layer thicknesses, synthetic antiferromagnet in the reference layer, a layer structure of this kind can be pinned, even with these low field strengths, at temperatures above the blocking-temperature.

The structuring element 18 can be deposited by a plating method and is usually between 1 μm and 20 μm high. A NiFe structure in particular, for example made of NiFe 8020, is used for this purpose. The resistance element 14 to be pinned is closely adjacent to the boundary edge 20 of the structuring element 18. Areas of approx. 5 μm can be pinned, wherein the areas to be pinned can be partially covered by the structuring element 18. Oppositely pinned resistance elements 14 can be arranged very closely adjacent to one another. In doing so, the resistance elements 14 have identical material characteristics, such as barrier resistance and TMR-effects for example. This enables parallel Wheatstone bridge branches with different pinning directions to be structured identically in order to achieve an optimised offset value. The insulation layer can be made from SiN or $Al_2O_3$, for example, with a layer thickness of 30 nm to 5000 nm. After depositing a seed layer, the soft magnetic structuring element 18 can be built up by means of an electrogalvanic method. The structuring element 18 can be formed by a structuring method and subjected to a perpendicular preconditioning magnetic field in order to carry out pinning. After removing the soft magnetic structuring element 14, the insulating layer 76 can be selectively opened in order to enable electrical contact to be made with the resistance elements 14. In contrast to classic pinning devices, in which magnetic fields are applied parallel to the chip surface in-plane, with the help of the proposed magnetic field preconditioning apparatus 50, pinning can be carried out by means of a magnetic field 38 aligned perpendicular to the chip surface 36. The strength of the preconditioning magnetic field can be adjusted by means of an adjustable air gap 34.

REFERENCE SIGNS

10 Magnetic field sensor device
12 Chip substrate
14 Resistance element
18 Soft magnetic structuring element
20 Soft magnetic boundary edge
22 Boundary edge of resistance element
24 Wheatstone measuring bridge
26 Bridge resistance 28 Lower bridge arm
30 Upper bridge arm
32
34 Adjustable air gap
36 Chip substrate surface
38 Preconditioning magnetic field
40 Measuring bridge contact surface
42 Chip substrate underside
44 Soft magnetic structuring layer surface
46 Boundary edge stray field
48
50 Magnetic field preconditioning apparatus
52 Oven
54 Heating device
56 Pole surface
58 Opposite pole surface
60 Air gap adjustment device
62 Chip substrate retaining device
64 Pole spacing adjustment device
66 Magnetic field generating device
68 Permanent magnet
70 Oven door
72 Pole shoe
74 Flux guiding cut-outs
76 Insulation layer
78 Guided magnetic flux
80 Iron yoke
82 Ferromagnetic layer
84 Intermediate layer
86 Antiferromagnetic layer/Antiferromagnet
88 Contact layer
90 Protective layer/Insulating layer
92 Reference layer
94 Detection layer

The invention claimed is:

1. A method for a permanent magnetisation of at least one ferromagnetic layer in a magnetic field sensor device deposited on a chip substrate comprising the following steps:
producing a magnetoresistive resistance element on a chip substrate which comprises at least one ferromagnetic layer and at least one antiferromagnetic layer, wherein an exchange coupling, which disappears on reaching a blocking temperature, acts between the at least one ferromagnetic layer and the at least one antiferromagnetic layer;
depositing at least one soft magnetic structuring element on the chip substrate adjacent to or partially overlapping the resistance element;
heating the resistance element-to above the blocking temperature of the material of the antiferromagnetic layer and coupling of a preconditioning magnetic field;
cooling the resistance element to below the blocking temperature;
removing the preconditioning magnetic field,
arranging the soft magnetic structuring element such that the coupled preconditioning magnetic field penetrates the structuring element substantially perpendicular to a chip surface and, at a location of the resistance element, generates magnetic field components parallel to the chip surface which penetrate the at least one ferromagnetic layer of the resistance element at least in some areas;
wherein two or more resistance elements are associated with the soft magnetic structuring element while carrying out a permanent magnetization of the at least one ferromagnetic layer of the resistance elements in a same direction or different directions parallel to the chip substrate surface.

2. A method according to claim 1, wherein magnetisation directions of the ferromagnetic layers of the resistance elements lie either parallel or nonparallel to one another.

3. A method according to claim 1, wherein at least two or more resistance elements are used to form at least one upper or lower bridge arm of a Wheatstone measuring bridge.

4. A method according to claim 1, wherein the resistance elements comprise GMR layer systems and/or TMR layer systems.

5. A method according to claim 1, wherein at least one boundary edge of the soft magnetic structuring element runs substantially parallel or tangential to a boundary edge of a resistance element, wherein the resistance element is overlapped in some areas by the soft magnetic structuring element, and wherein the overlapping has a magnitude of 5 µm or less.

6. A method according to claim 1, wherein the structuring element is formed in such a way that flux density of the emerging magnetic stray fields is guided and amplified by salient pole shoes or flux guiding cut-outs in the structuring element.

7. A method according to claim 1, wherein the resistance elements are insulated from the soft magnetic structuring element by an insulation layer comprising a layer of SiN or $Al_2O_3$ with a thickness of 30 nm to 5 µm.

8. A method according to claim 1, wherein the soft magnetic structuring element is produced by depositing or building up a layer of soft magnetic material on the chip substrate comprising NiFe with a layer thickness of 1,000 nm to 20 µm, by an electrogalvanic deposition method and a lithographic structuring method for structuring individual soft magnetic structuring elements.

9. A method according to claim 1, wherein, on completion of the pinning process, the soft magnetic structuring element(s) are removed from the chip substrate.

10. A magnetic field preconditioning apparatus for magnetic preconditioning of resistance elements of a field sensor device deposited on a chip substrate, wherein the magnetic field preconditioning apparatus comprises an oven and a magnetic field generating device having a pole and an opposite pole surface in an interior of the oven, wherein at least one chip substrate with at least one soft magnetic structuring element can be placed between pole and opposite pole surface in order to achieve a magnetic preconditioning of resistance elements arranged on the chip substrate by a preconditioning magnetic field which is aligned perpendicular to a chip substrate surface.

11. A magnetic field preconditioning apparatus according to claim 10, wherein the magnetic field generating device comprises a permanent magnet which is arranged in the oven, wherein a strength of the preconditioning magnetic field can be set by an adjustable air gap between the permanent magnet and the pole and opposite pole surface by an air gap adjustment device.

12. A magnetic field sensor device for detecting at least one component of an external magnetic field, comprising a magnetoresistive resistance, wherein the magnetic field sensor device is produced in accordance with a method according to claim 1.

* * * * *